(12) United States Patent
Das

(10) Patent No.: US 7,944,726 B2
(45) Date of Patent: May 17, 2011

(54) LOW POWER TERMINATION FOR MEMORY MODULES

(75) Inventor: Ripan Das, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 288 days.

(21) Appl. No.: 12/242,054

(22) Filed: Sep. 30, 2008

(65) Prior Publication Data

US 2010/0082911 A1  Apr. 1, 2010

(51) Int. Cl.
  *G11C 5/06* (2006.01)

(52) U.S. Cl. ............... 365/63; 365/189.16; 365/189.15; 365/189.03; 365/191; 365/192; 365/198; 365/230.03; 365/230.06; 326/30; 711/E12.001; 711/154

(58) Field of Classification Search .............. 365/63, 365/189.16, 189.15, 189.03, 191, 192, 198, 365/230.03, 230.06; 711/E12.001, 154; 326/30
See application file for complete search history.

(56) References Cited

U.S. PATENT DOCUMENTS

| 7,127,584 | B1 | 10/2006 | Thompson et al. | |
|---|---|---|---|---|
| 7,194,572 | B2 | 3/2007 | Leddige et al. | |
| 7,342,411 | B2 | 3/2008 | Vergis et al. | |
| 7,372,293 | B2 | 5/2008 | Cox et al. | |
| 7,386,658 | B2 | 6/2008 | Rotithor et al. | |
| 7,414,426 | B2 | 8/2008 | Cox et al. | |
| 7,421,598 | B2 | 9/2008 | Brittain et al. | |
| 2007/0126463 | A1* | 6/2007 | Cox et al. | 326/30 |
| 2007/0150672 | A1 | 6/2007 | Alexander et al. | |
| 2008/0148037 | A1 | 6/2008 | Rothman et al. | |
| 2008/0162801 | A1 | 7/2008 | Das et al. | |
| 2008/0197877 | A1* | 8/2008 | Cox et al. | 326/38 |

OTHER PUBLICATIONS

JEDEC, Solid State Technology Association, Committee Letter Ballot, Subject: DDR3 SO-DIMM Design Specification, Battlo Template Version draft rev. G, JEDEC 2005.

Freescale Semiconductor Application Note, "Hardware and Layout Design Considerations for DDR Memory Interfaces," Document No. AN2582, Rev. 6, Apr. 2007.

* cited by examiner

*Primary Examiner* — Hoai V Ho
*Assistant Examiner* — Fernando N Hidalgo
(74) *Attorney, Agent, or Firm* — KED & Associates, LLP

(57) ABSTRACT

An apparatus is provided that includes a memory controller to provide a first on-die termination (ODT) signal and a second ODT signal, a memory channel, a first memory module to couple to the memory channel, and a second memory module to couple to the memory channel. The first memory module may include a first memory having a first ODT circuit to receive the first ODT signal, and a second memory having a second ODT circuit to receive the first ODT signal. The first ODT signal may disable the ODT circuit of the first memory when the first memory is to be ACTIVE.

8 Claims, 4 Drawing Sheets

LOW POWER TERMINATION FOR MEMORY MODULES

BACKGROUND

1. Field

Embodiments of the present invention may relate to on-die termination circuits on memory modules.

2. Background

Operating frequencies of integrated circuits such as memory devices are progressively increasing. Computing systems may be designed to transmit signals along their busses and between system components at comparable frequencies.

Difficulties may be encountered when transmitting and receiving data between system components (e.g., between integrated circuits) at high frequencies. Buses may behave like transmission lines, where impedance mismatches may lead to signal reflection and interference effects. Termination resistance can be used to maintain signal quality over interconnections by matching impedances to minimize or reduce signal reflections.

BRIEF DESCRIPTION OF THE DRAWINGS

Arrangements and embodiments may be described in detail with reference to the following drawings in which like reference numerals refer to like elements wherein.

DETAILED DESCRIPTION

Memory systems, such as double data rate (DDR) dynamic random access memory devices (DRAMs), may have multi-drop bus architectures that are terminated with a resistor (or resistor combination) that is resident on a motherboard and/or is resident on an integrated circuit.

An on-die termination (ODT) circuit may include a termination resistor (or resistor combination) that is resident on the integrated circuit. A value of the ODT circuit may be set when the system is initialized. After initialization, the ODT circuit may be enabled (or activated) or disabled (or deactivated) with the value that is set during initialization. This value may be subsequently changed.

Figure 1:
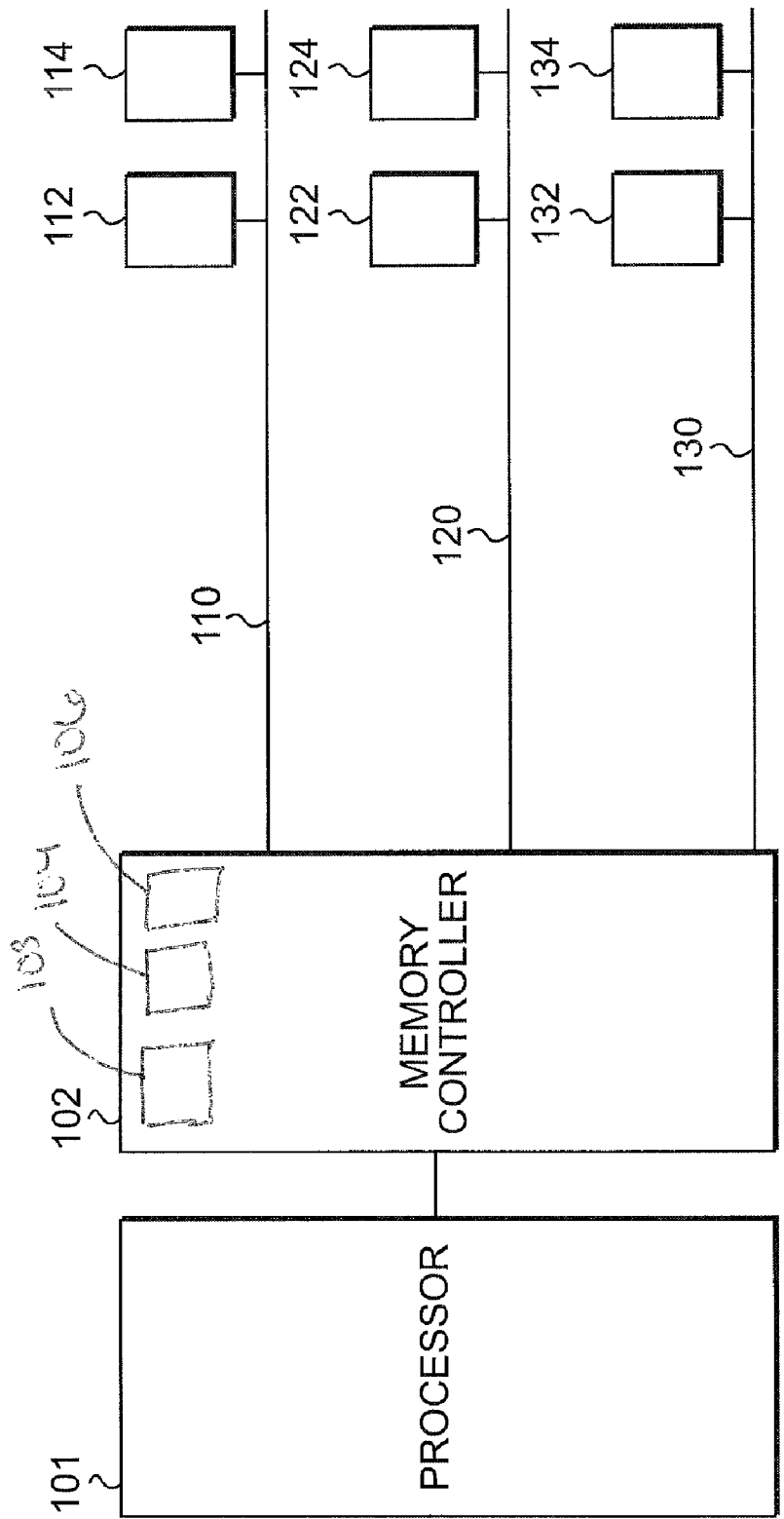
FIG. 1 is a diagram illustrating a computer system according to an example embodiment of the present invention.

FIG. 1 is diagram illustrating a computing system according to an example embodiment of the present invention. Other embodiments and configurations are also within the scope of the present invention.

More specifically, FIG. 1 shows a computing system 100 that includes a processor 101, a memory controller 102, three memory channels 110, 120 and 130 and a plurality of memory modules 112, 114, 122, 124, 132, 134. The memory controller 102 may be integrated on the processor die. The memory controller 102 may be any type of controller suitable for controlling, at least in part, the transfer of information between the processor 101 and one or more integrated circuits, such as memory devices on the memory modules.

The memory channels 110, 120 and 130 may each be an interconnect along a circuit board. Accordingly, the memory controller 102 and the memory modules 112, 114, 122, 124, 132, 134 may each couple to a memory channel (or an interconnect). Each of the memory channels 110, 120 and 130 may be separately coupled to a plurality of memory modules. For example, the memory channel 110 (or the interconnect) may be coupled by a connector to a first memory module 112, and the memory channel 110 (or the interconnect) may be coupled by a connector to a second memory module 114. The memory channel 120 (or the interconnect) may be coupled by a connector to a third memory module 122, and the memory channel 120 (or the interconnect) may be coupled by a connector to a fourth memory module 124. The memory channel 130 (or the interconnect) may be coupled by a connector to a fifth memory module 132, and the memory channel 130 (or the interconnect) may be coupled by a connector to a sixth memory module 134. Thus, each of the memory channels 110, 120 and 130 may be considered to have multiple memory modules per channel. Other numbers of memory modules per channel may also be provided.

Each of the memory modules 112, 114, 122, 124, 132 and 134 may be a dual in-line memory module (DIMM). Each DIMM may include a card that may be plugged via a connector or connectors along the memory channels (or the interconnects) of a circuit board.

Each of the memory modules 112, 114, 122, 124, 132, 134 may separately include a plurality of memory devices. The memory devices may be dynamic random access memory (DRAM), for example, such as double data rate (DDR) DRAM. Each memory module may include two ranks of memory devices. Each single rank may form an identical arrangement of memory devices with respect to the other rank.

The memory controller 102 may be coupled to the memory modules 112, 114, 122, 124, 132, 134 via the memory channels (i.e., along an interconnect). The memory channel (or interconnect) may include data lines, address lines, chip select lines and/or other lines. In addition, the memory controller 102 may be coupled with each rank of each of the memory modules 112, 114, 122, 124, 132, 134. The memory controller 102 may provide ODT signals along the memory channels for the memory devices. An ODT signal may be a signal that enables (or activates) or disables (or deactivates) an ODT circuit for a memory device (or an integrated circuit) or a group of memory devices (or integrated circuits). The ODT signal may enable the ODT circuits for an entire rank of the memory devices or disable the ODT circuits for the entire rank of the memory devices. The ODT pins for the memory devices within a rank may be daisy-chained together so that the same ODT signals are routed to the memory devices within the same rank.

The memory controller 102 may include circuitry 103 to access the memory of one memory module coupled to a memory channel (such as for READ operations and WRITE operations) and circuitry 104 to access memory of another memory module coupled to the memory channel. The memory controller 102 may also include circuitry 106 to provide ODT signals to each rank of each memory module.

Embodiments may have different numbers of memory channels, different numbers of memory modules, and/or different numbers of memory devices than as shown in FIG. 1. Embodiments may also have a different topology and/or different architectural features as compared to the architecture/topology shown in FIG. 1.

Figure 2:
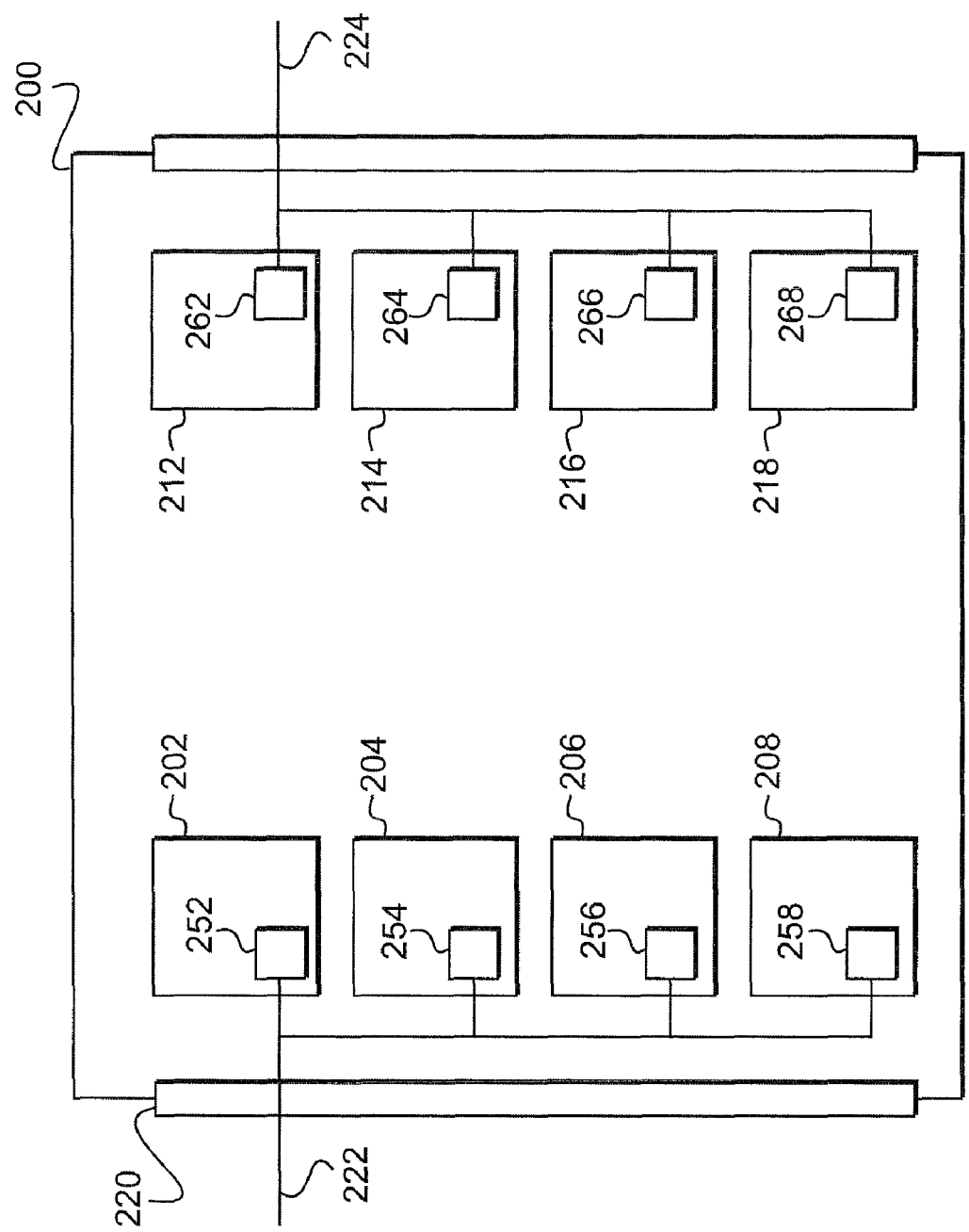
FIG. 2 shows a memory module according to an example embodiment of the present invention.

FIG. 2 shows a memory module according to an example embodiment of the present invention. Other embodiments and configurations are also within the scope of the present invention.

More specifically, FIG. 2 shows a memory module 200 that includes a plurality of memory devices 202, 204, 206, 208, 212, 214, 216 and 218. The memory module 200 also includes a plurality of pins 220 that couple to an interconnect (that includes the corresponding memory channel). Other numbers of memory devices may also be provided. Further, the pins 220 of the memory module may be provided along one side or more than one side of the memory module 200.

The memory devices within the memory module 200 may be divided into two ranks. For example, the memory devices 202, 204, 206 and 208 within the memory module 200 may be considered rank 1 and the memory devices 212, 214, 216 and 218 within the memory module 200 may be considered rank 2.

Each of the memory devices 202-218 may separately include at least one on-die termination (ODT) circuit. For example, the memory device 202 includes the ODT circuit 252, the memory device 204 includes the ODT circuit 254, the memory device 206 includes the ODT circuit 256 and the memory device 208 includes the ODT circuit 258. Additionally, the memory device 212 includes the ODT circuit 262, the memory device 214 includes the ODT circuit 264, the memory device 216 includes the ODT circuit 266 and the memory device 218 includes the ODT circuit 268. Other ODT circuits may also be provided for the memory devices.

Each of the ODT circuits 252, 254, 256 and 258, which corresponds to rank 1 components, may receive a similar first ODT signal at an input 222 (of the pins 220). Similarly, each of the ODT circuits 262, 264, 266 and 268, which correspond to rank 2 components, may receive a similar second ODT signal at an input 224 (of the pins 230). The ODT signal received at the input 222 and the ODT signal received at the input 224 may be different signals. The first ODT signal received at the input 222 may correspond to rank 1 components and the second ODT signal received at the input 224 may correspond to rank 2 components. The ODT signals control the enabling and disabling of the respective ODT circuits 252-268. More specifically, the ODT signal applied to the input 222 controls enabling and disabling of the ODT circuits 252, 254, 256 and 258. The ODT signal received at the input 224 controls enabling and disabling of the ODT circuits 262, 264, 266 and 268. The specific ODT signals for each of the ranks of each of the memory modules is received from the respective memory channel after being transmitted by the memory controller 102.

A specific tank of the memory modules may be considered ACTIVE (or will become ACTIVE) when the memory controller 102 is to perform a WRITE or READ operation with respect to that rank. In view of this, the memory controller 102 may provide an ODT signal to disable the specific rank of the memory devices that are to be ACTIVE. The other ranks of the memory modules may be considered non-ACTIVE. Accordingly, these other ranks (of the non-ACTIVE status) may receive ODT signals to enable the corresponding ODT circuits. The disabling of the ODT circuit for the ACTIVE rank may reduce power consumption, increase battery life and create better signal integrity.

Embodiments of the present invention may disable an ODT circuit(s) of a rank in an active memory module (such as DIMM) and may enable the ODT circuit(s) of a rank in the non-active memory module (DIMM). The active memory module may be the memory module that is accessed for READ and WRITE operations. The non-active memory module may be the memory module that is not accessed for READ and WRITE operations.

The ODT signal (or ODT EN signal) is a control signal that may selectively and independently disable or enable the ODT circuit(s) for each rank in the memory modules. The active rank ODT circuit(s) may be disabled and the ODT circuit(s) of the non-active rank may be enabled. This may help signal quality at the active rank of the active memory module. For example, at the active rank with a disabled ODT circuit, a signal level may get better voltage margin and a faster edge because of the self reflection. The ODT circuit at the non-active memory module may help reduce signal reflection. This may also help to reduce signal deterioration at the active rank due to reflection at the non-active ranks.

Figure 3:
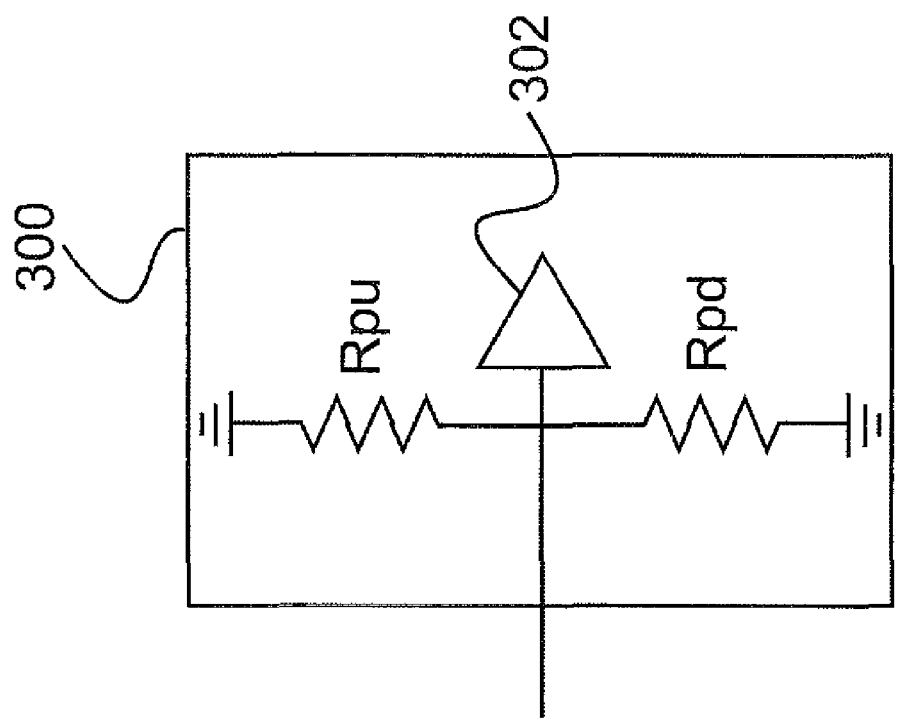
FIG. 3 shows an on-die termination circuit according to an example embodiment of the present invention.

FIG. 3 shows an ODT circuit according to an example embodiment of the present invention. Other embodiments and configurations are also within the scope of the present invention.

More specifically, FIG. 3 shows an ODT circuit 300 that includes a pull up resistor RPU, a pull down resistor RPD and a receiver 302. The elements may be formed of a transistor that operates based on the received ODT signal. Based on a received ODT signal at input 332, which may correspond to the input 222 shown in FIG. 2, the ODT circuit 300 may be enabled or disabled. For example, when the ODT circuit 300 is disabled, current may not flow from VCC to VSS and thus power consumption is reduced. On the other hand, when the ODT circuit 300 is enabled, current may flow from VCC to VSS. The transistor that forms the ODT circuit 300 may turn on or off so as to allow current to flow from VCC to VSS or to restrict current from flowing from VCC to Vss.

Figure 4:
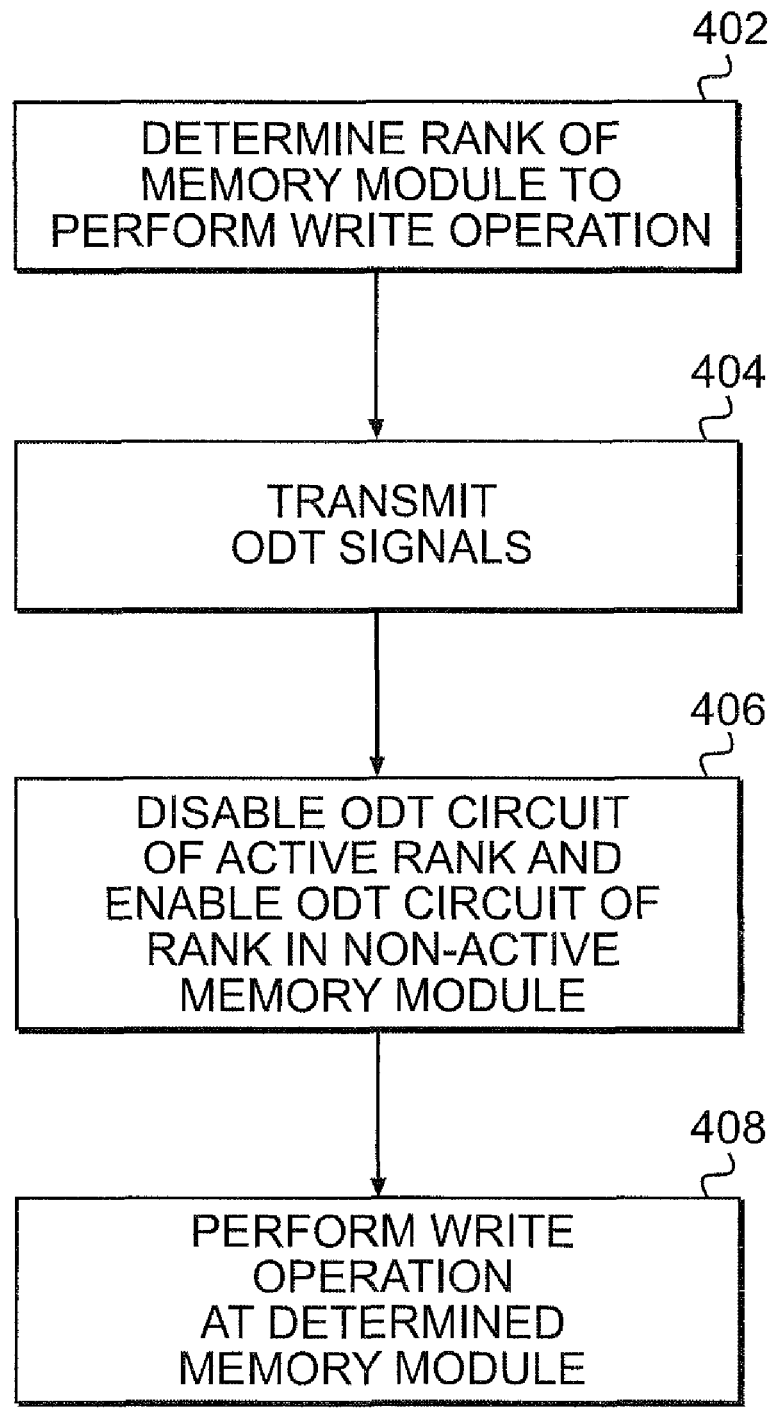
FIG. 4 is a flowchart showing an example embodiment of the present invention.

FIG. 4 shows a flowchart of an example embodiment of the present invention. Other operations, orders of operations and embodiments are also within the scope of the present invention.

More specifically, FIG. 4 shows a methodology to disable an ODT circuit for a rank of a memory module when the rank or the memory module is to be ACTIVE, such as during a READ or WRITE operation. For example, FIG. 4 shows that in operation 402 a rank may be determined for a specific memory module in order to perform a WRITE (or READ) operation. This determination may be performed at the memory controller 102 (FIG. 1). In operation 404, ODT signals may be transmitted along the memory channel to the memory modules. The transmitted ODT signals may include an ODT signal to enable a ACTIVE rank of ODT circuits of an ACTIVE memory module and another ODT signal to disable a rank of ODT circuits of a non-ACTIVE memory module.

In operation 406, the ODT circuit(s) for the rank of the non-ACTIVE memory module may be enabled and the ODT circuit(s) for the rank of the ACTIVE memory module may be disabled. An ODT signal may disable the ODT circuit of a first memory (of the corresponding rank) when the first memory is to be ACTIVE (such as for a WRITE operation to the rank) or is ACTIVE and another ODT signal may enable the ODT circuit of a second memory (i.e., the other rank) of the same memory module when the first memory is to be ACTIVE and/or the second memory is to be non-ACTIVE (or is non-ACTIVE). Still another ODT signal may be transmitted to the other memory module along the memory channel to enable the ODT circuit(s) of a rank of the non-ACTIVE memory module. Subsequently, in operation 408, a WRITE operation may be performed at the rank of the memory module (which has a disabled ODT circuit).

While FIG. 4 is described with respect to a WRITE operation, operations may also be performed with respect to READ operations. That is, FIG. 4 relates to disabling an ODT circuit for a rank of a specific memory module that will be in an ACTIVE status, such as for a READ operation or a WRITE operation. The ODT signal may disable the ODT circuit of the memory (or a memory module) when a READ operation or a WRITE operation is be performed with respect to the memory (or the rank of the memory).

Embodiments of the present invention may disable the ODT circuit of a memory of a first memory module when the first memory is be ACTIVE and may enable the ODT circuit of another memory on a second memory module when the first memory is to be ACTIVE.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
a memory controller having first circuitry to access a first memory and a second memory of a first memory module coupled to a memory channel, and the memory controller having second circuitry to access a third memory of a second memory module coupled to the memory channel, the first memory having a first on-die termination (ODT) circuit, the second memory having a second ODT circuit, the third memory having a third ODT circuit, and the memory controller having third circuitry to provide a first ODT signal to disable the first ODT circuit of the first memory when the first memory is to be active, the third circuitry to provide a second ODT signal to enable the second ODT circuit of the second memory of the first memory module when the first memory is to be active and the third circuitry to provide a third ODT signal to enable the third ODT circuit of the third memory when the first memory is to be active and the second memory module is to be non-active.

2. The apparatus of claim 1, wherein the third circuitry of the memory controller to provide a fourth ODT signal, and the second memory module includes:
a fourth memory having a fourth ODT circuit to receive the fourth ODT signal, the fourth ODT signal to enable or disable the fourth ODT circuit.

3. The apparatus of claim 1, wherein the memory channel to couple the memory controller to the first memory module and to the second memory module.

4. The apparatus of claim 1, wherein the first memory module comprises a dual-in-line memory module (DIMM) and the second memory module comprises another DIMM.

5. The apparatus of claim 1, wherein the first ODT signal to disable the ODT circuit of the first memory when a READ operation or a WRITE operation is to be performed with respect to the first memory.

6. A method comprising:
determining that a first memory of a first memory module coupled to a memory channel is to be active, the first memory module including the first memory having a first on-die termination (ODT) circuit and a second memory having a second ODT circuit;
transmitting a first ODT signal to the first memory along the memory channel based on the determination that the first memory is to be active, the first ODT signal to disable the first ODT circuit of the first memory when the first memory is to be active;
transmitting a second ODT signal along the memory channel;
receiving the second ODT signal at the second ODT circuit of the second memory of the first memory module;
enabling the second ODT circuit of the second memory based on the received second ODT signal when the first memory is to be active;
transmitting a third ODT signal along the memory channel; and
receiving the third ODT signal at a third ODT circuit of a third memory of a second memory module coupled to the memory channel; and
enabling the third ODT circuit of the third memory based on the received third ODT signal when the first memory is to be active and the second memory module is to be non-active.

7. The method of claim 6, wherein the first memory module comprises a dual-in-line memory module (DIMM) and the second memory module comprises another DIMM.

8. The method of claim 6, wherein the first ODT signal to disable the first ODT circuit of the first memory when a READ operation or a WRITE operation is to be performed with respect to the first memory.

* * * * *